United States Patent
Eckert et al.

(10) Patent No.: US 10,197,633 B2
(45) Date of Patent: Feb. 5, 2019

(54) DETECTING THE OPERATIONAL MANAGEMENT OF A BATTERY STORE

(71) Applicant: Siemens Aktiengesellschaft, Munich (DE)

(72) Inventors: Peter Eckert, Erlangen (DE); Christian Koermeier, Buttenheim (DE); Karsten Rechenberg, Dormitz (DE)

(73) Assignee: Siemens Aktiengesellschaft, Munich (DE)

( * ) Notice: Subject to any disclaimer, the term of this patent is extended or adjusted under 35 U.S.C. 154(b) by 67 days.

(21) Appl. No.: 15/308,189

(22) PCT Filed: May 4, 2015

(86) PCT No.: PCT/EP2015/059646
§ 371 (c)(1),
(2) Date: Nov. 1, 2016

(87) PCT Pub. No.: WO2015/169717
PCT Pub. Date: Nov. 12, 2015

(65) Prior Publication Data
US 2017/0052229 A1 Feb. 23, 2017

(30) Foreign Application Priority Data
May 5, 2014 (DE) .................. 10 2014 208 316

(51) Int. Cl.
*G01R 31/36* (2006.01)
*H01M 10/48* (2006.01)
*H01M 10/42* (2006.01)

(52) U.S. Cl.
CPC ..... *G01R 31/3651* (2013.01); *G01R 31/3679* (2013.01); *H01M 10/425* (2013.01);
(Continued)

(58) Field of Classification Search
CPC .......... G01R 31/3679; G01R 31/3651; H01M 10/48; H01M 10/425
See application file for complete search history.

(56) References Cited

U.S. PATENT DOCUMENTS 6,549,014 B1 4/2003 Kutkut et al.
2008/0186028 A1 8/2008 Jones et al.
(Continued)

FOREIGN PATENT DOCUMENTS

CN 101438452 A 5/2009
CN 103119456 A 5/2013
(Continued)

OTHER PUBLICATIONS

International Search Report PCT/ISA/210 for International Application PCT/EP2015/059646 dated Jul. 27, 2015.
(Continued)

*Primary Examiner* — Bryan Bui
(74) *Attorney, Agent, or Firm* — Harness, Dickey & Pierce, P.L.C.

(57) ABSTRACT

A method for detecting the use of a battery of an energy store system may include continuously generating a use profile by transforming data into a dynamically updated visual representation of the use of the battery storage device using a frequency distribution.

14 Claims, 2 Drawing Sheets

(52) U.S. Cl.
CPC .......... *H01M 10/48* (2013.01); *H01M 10/482* (2013.01); *H01M 2010/4271* (2013.01); *H01M 2010/4278* (2013.01)

(56) References Cited

U.S. PATENT DOCUMENTS

| | | |
|---|---|---|
| 2008/0231284 A1 | 9/2008 | Birke et al. |
| 2009/0218986 A1 | 9/2009 | Jarvinen |
| 2013/0241567 A1 | 9/2013 | Rischen |
| 2014/0077593 A1 | 3/2014 | Schaefer |
| 2014/0180612 A1* | 6/2014 | Rejman .............. G01R 31/3627 702/58 |
| 2014/0239900 A1* | 8/2014 | Abe .................... H01M 10/441 320/118 |

FOREIGN PATENT DOCUMENTS

| | | |
|---|---|---|
| CN | 203278324 U | 11/2013 |
| DE | 102007021921 A1 | 11/2008 |
| DE | 102011008466 A1 | 7/2012 |
| DE | 102012206336 A1 | 10/2013 |
| WO | WO-2006094287 A2 | 9/2006 |

OTHER PUBLICATIONS

Written Opinion of the International Searching Authority PCT/ISA/237 for PCT/EP2015/059646 dated Jul. 27, 2015.
Office Action for German Application No. 10 2014 208 316.8 dated Feb. 2, 2015.
Chinese Office Action dated Jul. 4, 2018 for corresponding Chinese Patent Application No. 201580020687.8 (with English translation).

* cited by examiner

DETECTING THE OPERATIONAL MANAGEMENT OF A BATTERY STORE

PRIORITY STATEMENT

This application is the national phase under 35 U.S.C. § 371 of PCT International Application No. PCT/EP2015/059646 which has an International filing date of May 4, 2015, which designated the United States of America and which claims priority to German patent application number DE 102014208316.8 filed May 5, 2014, the entire contents of which are hereby incorporated herein by reference.

FIELD

An embodiment of invention generally relates to a method for detecting the operational management of a battery storage device in an energy storage system. Moreover, an embodiment of the invention generally relates to an energy storage device and/or a computer program.

BACKGROUND

Below, a battery storage device is understood to mean a system of rechargeable storage cells. Such battery storage devices, for example in the form of battery cabinets, are used e.g. for the power supply of industrial plants. They are operated in conjunction with converters for rectifier or converter operation for coupling to an electrical AC voltage network and serve to ensure a stable operation in parallel to the public supply.

The service life of the battery storage device depends strongly on the operational management thereof. By way of example, important characteristics in this respect are the thermal load on the battery, the state of charge (SOC) and the time profile thereof, the number of charge and discharge cycles and the depth of the individual charge cycles. Moreover, critical events, such as e.g. overcurrent, exhaustive discharge, etc. may influence the service life.

The prior art has disclosed the practice of detecting characteristics of the battery storage device to be able to determine what load was applied to the latter during the use thereof. In this manner, it is possible to determine the aging of the battery storage device. This may have effects on possible guarantee claims.

In available battery storage devices, use is made of battery management systems (BMS) in order to monitor, inter alia, the charge state, the voltages and the temperatures of the individual battery modules. Modern battery management systems may also store these characteristics at the same time for the purposes of a subsequent evaluation.

However, storing data and subsequently analyzing all characteristics and events requires much outlay in the case of a service life of a battery system of typically 10 years or more, and therefore this is not practical. Therefore, only a restricted amount of data is stored in practice, for example for detecting the operational management for a specific period of time of two or three months. Subsequently, the already detected older data are overwritten with new data being added in each case. Therefore, it is always only possible to evaluate the operational management of the battery storage device during a just elapsed, comparatively short period of time. However, particularly in view of the long service life of the battery storage system, such a "snapshot" is insufficient for reliable assessment of possible guarantee claims of the user in relation to the producer of the battery system.

SUMMARY

At least one embodiment of the present invention provides a practical solution for detecting the operational management of a battery storage device. At least one embodiment of the present invention is directed to a method; an energy storage system; and/or a computer program. Advantageous embodiments of the invention are specified in the claims.

The advantages and configurations explained below in conjunction with the method also apply analogously to the system according to embodiments of the invention, and vice versa.

At least one embodiment of the present invention is directed to a method for detecting the operational management of a battery storage device in an energy storage system, comprising a continuous generation of a use profile illustrating the operational management of the battery storage device using means from descriptive statistics.

At least one embodiment of the present invention is directed to an energy storage system comprising a battery storage device and comprising a data detection unit, the data detection unit being embodied for the continuous generation of a use profile illustrating the operational management of the battery storage device using means from descriptive statistics.

At least one embodiment of the present invention is directed to a non-transitory computer readable medium storing a program for detecting the operational management of the battery storage device in an energy storage system, the program including computer program instructions for continuously generating a use profile illustrating the operational management of the battery storage device using means from descriptive statistics, when the computer program is run on a computer.

BRIEF DESCRIPTION OF THE DRAWINGS

The above-described properties, features and advantages of this invention and the manner in which they are achieved will become clearer and more easily understandable in conjunction with the following description of the exemplary embodiments, which are explained in more detail in conjunction with the drawings. In detail.

Figure 1:
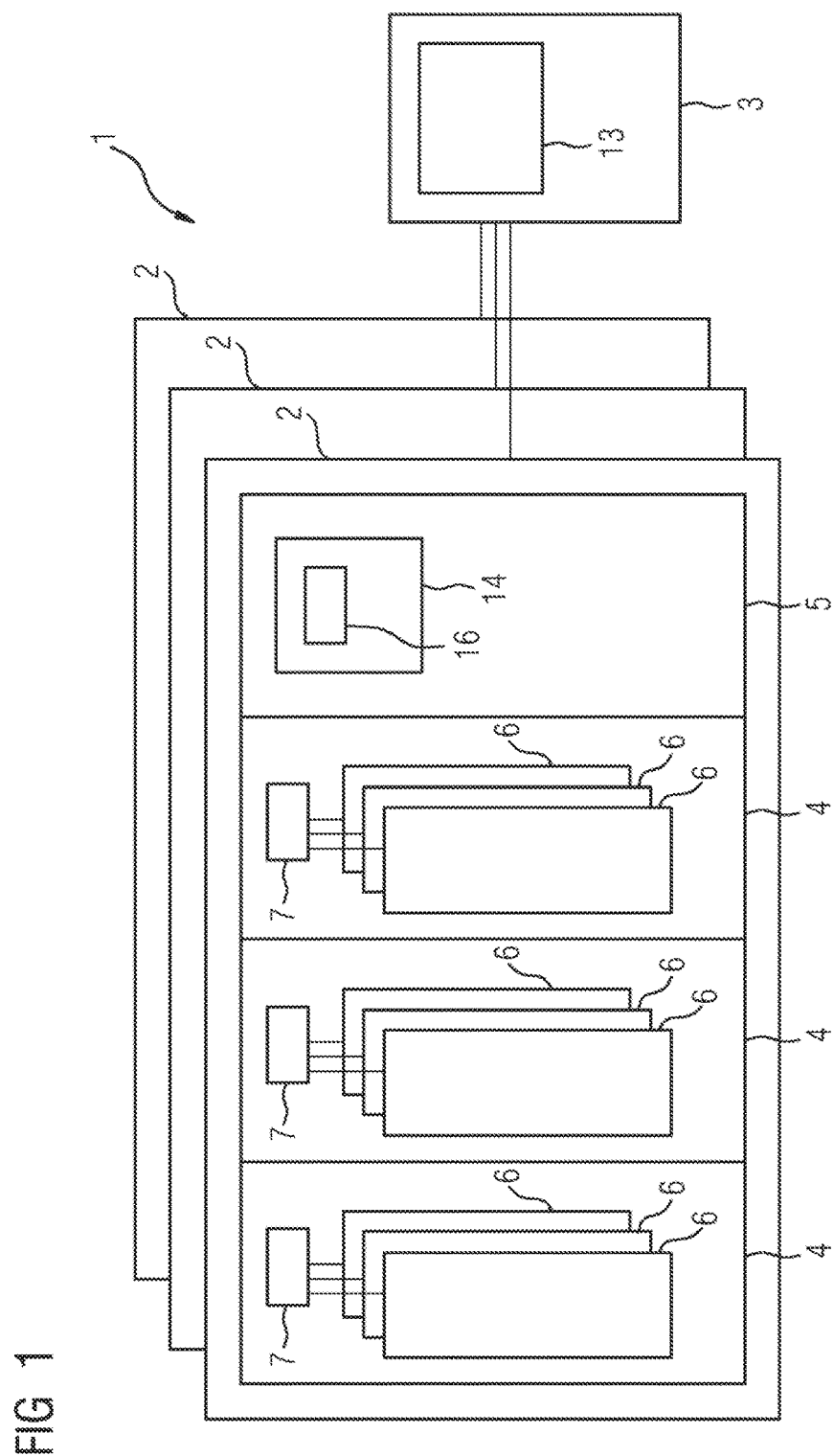
FIG. 1 shows an energy storage system.

The invention is only shown schematically and with the essential components thereof in all figures. Here, the same reference signs correspond to elements with the same or a comparable function.

DETAILED DESCRIPTION OF THE EXAMPLE EMBODIMENTS

No longer storing all characteristics and events of the operational management of the battery storage device is a core concept of an embodiment of the invention. Instead, a use profile of the battery storage device illustrating the operational management of the battery storage device using means from descriptive statistics is generated. In other words, there is immediate processing of detected data, this processing preferably already including a suitable analysis of the data, and only a "concentrate" of the detected data is stored in the form of a use profile.

According to at least one embodiment of the invention, the use profile is generated continuously, i.e. preferably at all times and without interruptions. Expressed differently, the use profile is constantly updated and therefore illustrates the respective current operational management up to this point in time. Hence, the use profile describes the operational management of the battery storage device during the entire service life thereof. The generated use profile is preferably stored as a modifiable but permanent, i.e. non-deletable, non-over writable data record.

For the purposes of generating the use profile, suitable data which are linked to the battery storage device are detected and processed. Preferably, these data comprise selected battery operating characteristics, battery operating events and/or battery states of the battery storage device, in particular the operating hours and the state of charge of the battery storage device, including the number and duration of the charge and discharge cycles. With the aid of these data, it is possible to establish the load on the battery storage device and the aging thereof in a particularly simple manner.

Under the aspect of data preparation, the processing of the detected data preferably comprises the establishment of suitable evaluation characteristics from the detected data. Instead of the detected data themselves, it is then only the number of the evaluation characteristics established therefrom which is stored.

Preferably, the processing of the detected data comprises a generation of a number of frequency distributions from the detected data and/or from the established evaluation characteristics, in particular a generation of frequency distributions of selected operating characteristics. The essential properties of these frequency distributions, such as e.g. measures of location (quantiles, trends), measures of dispersion (variabilities) and relationships (correlations) subsequently serve as part of the use profile for characterizing the operational management of the battery storage device.

Under the aspect of the data representation, the processing of the detected data preferably comprises the generation of a number of key figures (parameters), tables and/or diagrams. Using key figures, individual selected aspects of the detected data can be represented particularly easily in the form of a single number. The detected data may be ordered clearly with the aid of tables. Diagrams represent the detected data or specific aspect of these data particularly clearly in graphic form. The representation in the form of tables and/or graphics in particular is preferably used for illustrating the frequency distribution of the operating characteristics.

A suitable data detection unit serves for carrying out at least one embodiment of the invention in an energy storage system according to at least one embodiment of the invention comprising the battery storage device. The data detection unit is embodied to generate the use profile illustrating the operational management of the battery storage device using means from descriptive statistics. The data detection unit is preferably the battery management system of the respective battery storage device, which was trained accordingly for this purpose.

The use profile can be recalled at any desired subsequent time and the data contained therein may be read out for further use. Preferably, the current actual load on the battery storage device is establishable from the use profile generated thus and said current actual load may be provided in the form of a key figure. This is either also carried out by the data detection unit of the energy storage system, or else with the aid of an external aid, such as e.g. analysis software of a servicing technician provided with the use profile generated by the data detection unit.

An advantage of the procedure according to at least one embodiment of the invention includes being able to generate an accurate illustration of the operational management of the battery storage device with little computational outlay and small storage capacities. On the one hand, this reduces the expenditure. On the other hand, this may also increase the availability of the battery storage device since, for example, the charge states of the cells may be balanced in good time or else the ideal time for balancing of the state of charge of the cells may be established in an automated manner.

A modular energy storage system 1 embodied for a medium-high voltage network is depicted in FIG. 1. The energy storage system 1 comprises a plurality of storage containers 2 and a central control unit 3. Provided in each storage container 2 are a plurality of energy storage cabinets 4, each with a combined open-loop control, closed-loop control and supply connection cabinet 5 with a converter 14. Provided in each energy storage cabinet 4 are a plurality of battery storage devices 6 composed of Li-ion battery modules, and a battery management system 7 for controlling the state of charge of the battery storage device 6. By way of example, the nominal power of the energy storage cabinet 4 is 32 kW to 96 kW.

Initially, characteristic ranges, events and states are defined depending on the type and producer of the battery storage device 6.

Then, as an alternative to storing data of all operating characteristics, there is a detection of characteristic ranges, summed over time, by the battery management systems 7 of each individual energy storage cabinet 4 during the operation of the battery storage device 6. To this end, the respective characteristic is decomposed into quantiles and the frequency of the occupancy of the measurement value in this quantile is detected. In this manner, the profile of the characteristic can be illustrated in a very simple and accurate manner, and with little storage space to be provided by the battery management system 7, by way of a table, in which the quantiles and the frequencies correspondingly assigned to these quantiles are captured.

As an alternative to storing data from all events, counters are only detected for critical events and states during operation. These counter detections are also undertaken by the battery management systems 7 of each individual energy storage cabinet 4.

The detection of the characteristic range, summed over time, facilitates a very fast and relatively accurate deduction about the manner of operation of the corresponding battery storage device 6 and may therefore serve as evidence for proper operation. By way of example, if the data are represented as a bar chart of the operating hours in the corresponding charge states, as illustrated in FIG. 2, it is possible to identify at a glance whether the respective battery storage device 6 was operated uniformly or else predominantly in a specific range.

Figure 2:
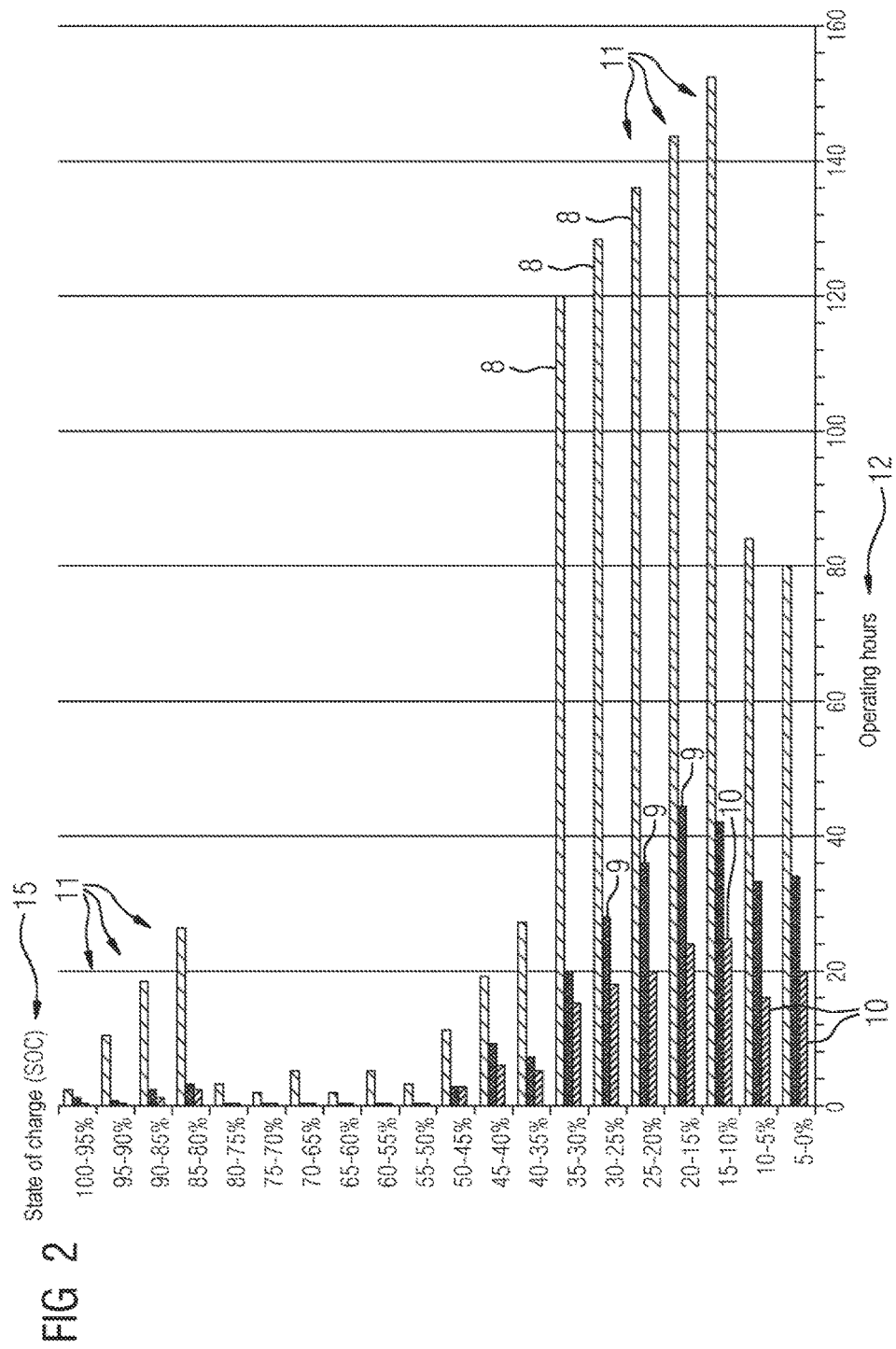
FIG. 2 shows a graphic representation of a battery operating characteristic.

For the comprehensive representation of data depicted in FIG. 2, the possible charge state 15 of the battery storage device 6 is subdivided into twenty 5% intervals 11 of equal size. Then, what is detected during the operating duration of the battery storage device 6 is the extent to which, i.e. for how many operating hours 12, the battery storage device 6 was situated within each interval 11. In so doing, a distinction is simultaneously made as to whether the battery storage device 6 was in a load-free rest state or whether the battery storage device 6 was being charged or discharged. To this end, the bar chart respectively shows a bar 8 representing the operating hours 12 in the rest state, a bar 9 representing the operating hours 12 in the charge state and a bar 10 representing the operating hours 12 in the discharge state for each interval 11. In this manner, the three main criteria for assessing the load of the battery storage device 3 are detected, processed and described with means from descriptive statistics, more precisely in the form of a frequency distribution.

Now, using such a graphical representation, as may be displayed by the data detection unit, in this case the battery management system 7, e.g. on a screen 13 of the human-machine interface of the energy storage system 1 used by a servicing technician, it is possible to identify at a glance that the relevant battery storage device 6 was predominantly in a lower region of the state of charge (10% to 30% state of charge), which is not ideal for a battery storage device based on Li-ions. The range of the ideal charge state (for example from 60% to 80%) could be illustrated as well, which would once again improve the quick assessability of this key figure.

It is likewise possible to identify from the lengths of the bars 9, 10 in FIG. 2 that the battery storage device 6 always took longer to charge than to discharge. The relationship between charge duration and discharge duration depending on the state of charge of the battery storage device 6 is likewise immediately identifiable.

Moreover, with the aid of the counter detections, it is moreover possible to establish whether the battery storage device 6 had increased use in critical regions. By way of example, it is additionally possible to analyze the ratio of operating hours or hours since first operation to the number of charge and discharge cycles. This value provides information about the general load on the battery storage device 6.

The ratio of the number of faults or the summed hours in a fault region to the operating hours provides further indications for the stress levels of the battery storage device 6.

Advantageously, selected or all of the following operating data are detected.

Operating hours: hour counter for the operation, i.e. converter in operation and batteries being charged or discharged.

Hours since first operation: hour counter for the installation, i.e. installation being under auxiliary voltage.

Energy input: energy counter for the entire energy input (effective power and reactive power) from the network for the installation.

Energy supply: energy counter for the entire energy output (effective power and reactive power) into the network for the installation.

Number of charge cycles: counter for the number of cycles during which the storage device was charged.

Number of discharge cycles: counter for the number of cycles during which the storage device was discharged.

Number of "battery full" notifications: counter for the number of notifications at which the entire storage device reports fully charged.

Number of "battery empty" notifications: counter for the number of notifications at which the entire storage device reports completely empty.

Number of switching cycles of the DC switch: counter for the operating cycles of the DC switch.

Advantageously, selected or all of the following maximum and minimum values are detected.

Maximum charge current: largest value of the current ever reached when charging the batteries.

Minimum charge current: smallest value of the current ever reached when discharging the batteries.

Maximum temperature: highest temperature ever reached by the battery storage device.

Minimum temperature: lowest temperature ever reached by the battery storage device.

Maximum cell voltage: highest cell voltage ever reached by the individual battery cells.

Minimum cell voltage: lowest cell voltage ever reached by the individual battery cells.

Advantageously, selected or all of the following faults and warnings are detected.

Number of overcurrent triggers: counter for the number of overcurrent triggers reported by the storage device, i.e. the storage device switched off with overcurrent.

Number of communication errors: counter for the number of communication errors reported by the storage device.

Number of short-circuit triggers: counter for the number of short-circuit triggers reported by the storage device, i.e. the storage device switched off with a short circuit.

Number of temperature warnings: counter for the number of temperature warnings reported by the storage device, i.e. each new report of a "temperature warning" is counted.

Number of overvoltage triggers: counter for the number of overvoltage triggers reported by the storage device, i.e. the storage device switched off with overvoltage.

Number of undervoltage triggers: counter for the number of undervoltage triggers reported by the storage device, i.e. the storage device switched off with undervoltage.

Operating hours with temperature warnings: hour counter for the time during which the storage device was operated with the pending "temperature warning" notification.

Operating hours with overload warning: hour counter for the time during which the storage device was operated with the pending "overload warning" notification.

Summed hours with temperature alarm: hour counter for the time during which the storage device reported excessive temperature.

Summed hours with temperature warning: hour counter for the time during which the storage device reported a temperature warning (operation or no operation of the installation).

Summed hours with exhaustive discharge (SOC<0): hour counter for the time during which the storage device reported an exhaustive discharge for a module.

Summed hours with overcharging (SOC>100): hour counter for the time during which the storage device reported overcharging or a module.

Instead of individually for each energy storage cabinet 4, the storage and/or evaluation of the detected data of the individual battery storage devices 6 may also take place in a comprehensive manner for the entire storage container 2 in a correspondingly embodied closed-loop control unit 16 of the converter 14, wherein the data to be acquired are forwarded to the closed-loop control unit 16 either directly from the battery storage devices 6 or else via the corresponding battery management systems 7. Accordingly, there may also be storage and/or evaluation of the detected data for a plurality of storage containers 2 in the central control unit 3 of the energy storage system 1.

The energy storage system 1 according to at least one embodiment of the invention is embodied to carry out the described method. Preferably, the data detection unit of the energy storage system 1 is a data processing unit, embodied to carry out all steps related to the processing of data in accordance with the method described here. The data processing unit preferably has a number of functional modules, with each functional module being embodied to carry out a specific function or a number of specific functions in accordance with the described method. The functional modules may be hardware modules or software modules. Expressed differently, to the extent that the invention relates to the data processing unit, said invention can be realized in the form of computer hardware or in the form of computer software or in a combination of hardware and software. To the extent that the invention is implemented in the form of software, i.e. as a computer program, all of the described functions are realized by computer program instructions when the computer program is run on a computer with a processor. Here, the computer program instructions are realized in a manner known per se in any programming language and may be provided to the computer in any form, for example in the form of data packets which are transferred via a computer network or in the form of a computer program stored on a disk, a CD-ROM or any other data medium.

The described methodology may also be transferred to other systems, the load or service life of which can be determined on the basis of an analysis of the operational management depending on characteristics (such as e.g. current or voltage).

Even though the invention was illustrated more closely and described in detail by the preferred exemplary embodiment, the invention is not restricted to the disclosed examples and other variations may be derived therefrom by a person skilled in the art, without departing from the scope of protection of the invention.

LIST OF REFERENCE SIGNS

1 Energy storage system
2 Storage container
3 Central control unit
4 Energy storage cabinet
5 Combination cabinet
6 Battery storage device
7 Battery management system
8 Bar (rest mode)
9 Bar (charge mode)
10 Bar (discharge mode)
11 Characteristic interval (state of charge)
12 Operating hours
13 Screen
14 Converter
15 State of charge (SOC)
16 Control unit

The invention claimed is:

1. A method for managing use of a battery storage device in an energy storage system, the method comprising:
   continuously measuring data associated with one or more of voltage, current and run-time of the battery storage device;
   determining, for each of a plurality of charge states, a duration in which the battery storage device is in a plurality of operating states during respective ones of the plurality of charge states based on the data to generate a frequency distribution, the plurality of operating states including a rest state, a charge state and a discharge state; and
   continuously generating a use profile by transforming the data into a dynamically updated visual representation of the use of the battery storage device using the frequency distribution.

2. The method of claim 1, wherein the data includes at least one of battery operating characteristics, battery operating events and battery states.

3. The method of claim 2, wherein the data includes operating hours and the state of charge of the battery storage device.

4. The method of claim 3, further comprising:
   establishing evaluation characteristics from the data.

5. The method of claim 4, wherein dividing the data into a number of frequency distributions.

6. The method of claim 5, wherein the dynamically updated visual representation includes a number of at least one of characteristics, tables and diagrams from the data.

7. The method of claim 3, further comprising:
   dividing the data into a number of frequency distributions.

8. The method of claim 3, wherein the dynamically updated visual representation includes a number of at least one of characteristics, tables and diagrams from the data.

9. The method of claim 2, further comprising:
   dividing the data into a number of frequency distributions.

10. The method of claim 2, wherein the dynamically updated visual representation includes a number of at least one of characteristics, tables and diagrams from the data.

11. The method of claim 2, further comprising:
    determining a load of the battery storage device from the generated use profile.

12. The method of claim 1, further comprising:
    determining a load of the battery storage device from the generated use profile.

13. An energy storage system comprising:
    a battery storage device; and
    a controller configured to managing use of the battery storage device by,
      continuously measuring data including voltage, current and run-time of the battery storage device,
      determining, for each of a plurality of charge states, a duration in which the battery storage device is in a plurality of operation states during respective ones of the plurality of charge states based on the data to generate a frequency distribution, the plurality of operating states including a rest state, a charge state and a discharge state, and
      continuously generating a use profile by transforming the data into a dynamically updated visual representation of the use of the battery storage device using the frequency distribution.

14. A non-transitory computer readable medium storing a program, the program including computer program instructions that, when executed by a processor, configure the processor to, manage use of a battery storage device by,
    continuously measuring data including voltage, current and run-time of the battery storage device,
    determining, for each of a plurality of charge states, a duration in which the battery storage device is in a plurality of operating states during respective ones of the plurality of charge states based on the data to generate a frequency distribution, the plurality of operating states including a rest state, a charge state and a discharge state, and
    continuously generating a use profile by transforming the data into a dynamically updated visual representation of the use of the battery storage device using the frequency distribution.

* * * * *